(12) United States Patent
Luan (10) Patent No.: US 9,768,341 B2
(45) Date of Patent: Sep. 19, 2017

(54) PROXIMITY DETECTOR DEVICE WITH INTERCONNECT LAYERS AND RELATED METHODS

(71) Applicant: STMICROELECTRONICS (SHENZHEN) R&D CO., LTD., Nanshan, Shenzhen (CN)

(72) Inventor: Jing-En Luan, Shenzhen (CN)

(73) Assignee: STMICROELECTRONICS (SHENZHEN) R&D CO., LTD., Shenzhen (CN)

( * ) Notice: Subject to any disclaimer, the term of this patent is extended or adjusted under 35 U.S.C. 154(b) by 205 days.

(21) Appl. No.: 14/259,344

(22) Filed: Apr. 23, 2014

(65) Prior Publication Data
US 2014/0319548 A1    Oct. 30, 2014

(30) Foreign Application Priority Data

Apr. 28, 2013 (CN) .......................... 2013 1 0158554

(51) Int. Cl.
*H01L 31/173* (2006.01)
*H01L 31/0203* (2014.01)
(Continued)

(52) U.S. Cl.
CPC .......... *H01L 31/173* (2013.01); *G01S 7/4813* (2013.01); *G01S 17/026* (2013.01);
(Continued)

(58) Field of Classification Search
CPC ........... H01L 31/0203; H01L 31/02327; H01L 24/19; H01L 25/167; H01L 31/02164;
(Continued)

(56) References Cited

U.S. PATENT DOCUMENTS 4,458,152 A    7/1984  Bonora
5,374,787 A   12/1994  Miller et al.
(Continued)

FOREIGN PATENT DOCUMENTS

CN      203422471      2/2014

OTHER PUBLICATIONS

Myllymaki et al., "Measurement method for sensitivity analysis of proximity sensor and sensor antenna integration in a handheld device", Progress in Electromagnetics Research C, vol. 20, 2011, pp. 255-268.
(Continued)

*Primary Examiner* — David Vu
*Assistant Examiner* — Mouloucoulaye Inoussa
(74) *Attorney, Agent, or Firm* — Slater Matsil, LLP (57) ABSTRACT

A proximity detector device may include a first interconnect layer including a first dielectric layer, and first electrically conductive traces carried thereby, an IC layer above the first interconnect layer and having an image sensor IC, and a light source IC laterally spaced from the image sensor IC. The proximity detector device may include a second interconnect layer above the IC layer and having a second dielectric layer, and second electrically conductive traces carried thereby. The second interconnect layer may have first and second openings therein respectively aligned with the image sensor IC and the light source IC. Each of the image sensor IC and the light source IC may be coupled to the first and second electrically conductive traces. The proximity detector device may include a lens assembly above the second interconnect layer and having first and second lenses respectively aligned with the first and second openings.

20 Claims, 8 Drawing Sheets

(51) Int. Cl.
*H01L 31/0232* (2014.01)
*G01S 7/481* (2006.01)
*G01S 17/02* (2006.01)
*H01L 23/00* (2006.01)
*G01S 17/08* (2006.01)

(52) U.S. Cl.
CPC .......... *H01L 24/19* (2013.01); *H01L 31/0203* (2013.01); *H01L 31/02327* (2013.01); *G01S 17/08* (2013.01); *H01L 2224/48091* (2013.01); *H01L 2224/73265* (2013.01); *H01L 2224/8592* (2013.01); *H01L 2924/12041* (2013.01); *H01L 2924/181* (2013.01)

(58) Field of Classification Search
CPC ............. H01L 27/14618; H01L 31/167; H01L 31/173; H01L 31/125; G01S 17/026; G01S 7/4813; H03K 17/941
USPC .............. 257/82, 774, 432; 438/25; 356/614
See application file for complete search history.

(56) References Cited

U.S. PATENT DOCUMENTS

| | | | |
|---|---|---|---|
| 5,495,077 A | 2/1996 | Miller et al. | |
| 5,648,642 A | 7/1997 | Miller et al. | |
| 6,281,882 B1 | 8/2001 | Gordon et al. | |
| 7,339,684 B2 | 3/2008 | Njolstad | |
| 2004/0263668 A1* | 12/2004 | Kim | H01L 27/14618 348/340 |
| 2009/0057544 A1 | 3/2009 | Brodie et al. | |
| 2011/0250928 A1 | 10/2011 | Schlub et al. | |
| 2012/0035883 A1 | 2/2012 | Teissier et al. | |
| 2012/0132793 A1 | 5/2012 | Campbell et al. | |
| 2012/0133955 A1 | 5/2012 | Baxter | |
| 2012/0133956 A1* | 5/2012 | Findlay | H01L 31/173 356/614 |
| 2012/0139870 A1 | 6/2012 | Beyly et al. | |
| 2012/0153120 A1 | 6/2012 | Baxter | |
| 2012/0194479 A1 | 8/2012 | Stark et al. | |
| 2012/0248625 A1* | 10/2012 | Coffy | G01S 7/4813 257/774 |
| 2013/0033736 A1* | 2/2013 | McCabe | B60R 1/088 359/267 |
| 2013/0248887 A1* | 9/2013 | Coffy | G01S 7/481 257/81 |

OTHER PUBLICATIONS

Veygman et al., "Detect further target with proximity sensor", 2012, pp. 1-2.
Guke, "Ultrasonic proximity sensor for blind guiding", China Academic Journal Electronic Publishing House, Aug. 2009, pp. 1-2.

* cited by examiner

PROXIMITY DETECTOR DEVICE WITH INTERCONNECT LAYERS AND RELATED METHODS

TECHNICAL FIELD

The present disclosure relates to the field of image sensor devices, and, more particularly, to a proximity detector device and related methods.

BACKGROUND

Typically, electronic devices include one or more image sensor modules for providing enhanced media functionality. For example, the typical electronic device may utilize the image sensor modules for photo capturing and video teleconferencing. Some electronic devices include additional image sensor devices used for other purposes, such as a proximity detector.

For example, the electronic device may use the proximity detector to provide object distances for providing focusing adjustment to the camera purposed image sensor modules. In mobile device applications, the proximity detector may be used to detect when the user's hand is nearby, thereby quickly and accurately waking the device from a power saving sleep mode. Typically, the proximity detector comprises a light source directing radiation to a potential nearby object, and an image sensor receiving the radiation reflected off of the nearby object.

For example, U.S. Patent Application No. 2009/0057544 to Brodie et al, assigned to the present application's assignee, discloses an image sensor module for a mobile device. The image sensor module comprises a lens, a housing carrying the lens, and a lens cap over the lens and housing. The image sensor module includes a barrel mechanism for adjusting the lens. During manufacture of an electronic device including one or more image sensor modules, there is a desire to manufacture the electronic device as quickly as possible, particularly in mass production runs.

The typical image sensor module is manufactured in a multi-step process. The first steps include semiconductor processing to provide the image sensor integrated circuit (IC). The next steps include some form of testing for the image sensor IC and packaging. The image sensor IC may be assembled into the image sensor module, along with a lens and movable barrel if needed. This assembly of the image sensor module may be performed manually or via machine. For example, in electronic devices that use surface mounted components, a pick-and-place (P&P) machine may assemble the components onto a printed circuit board (PCB). A drawback to such singular packaging is that it may be relatively inefficient and also may require that each device be tested individually, adding to the manufacturing time.

An approach to an image sensor is disclosed in U.S. Patent Application Publication No. 2012/0248625 to Coffy et al., assigned to the present application's assignee. This image sensor comprises a transparent support, a pair of ICs on the transparent support, and encapsulation material on the transparent support and surrounding the pair of ICs.

Figure 1:
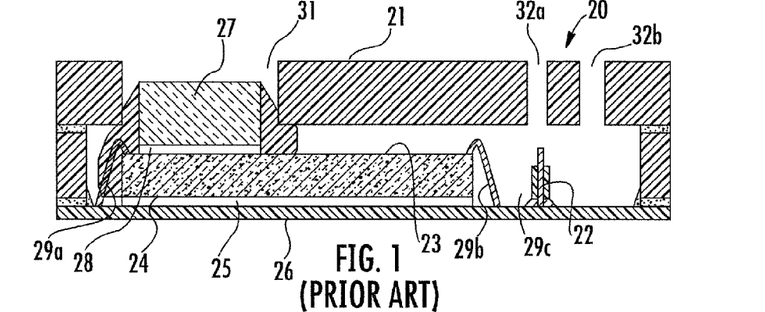
FIG. 1 is a schematic cross-sectional view of a proximity detector device, according to the prior art.

Referring now to FIG. 1, a proximity detector 20, as in the prior art, includes a dielectric layer 26, an image sensor IC 24 on the dielectric layer, a light source device 22 also on the dielectric layer, and an adhesive material 25 between the image sensor IC and the dielectric layer. The proximity detector 20 includes a cap 21 positioned on the dielectric layer 26 and having a plurality of openings 31, 32a-32b therein, and transparent adhesive material 23 covering the light source device 22. The proximity detector 20 also includes a lens 27 carried by the cap 21, and a plurality of wire bonds 29a-29c coupling the image sensor IC 24 and the light source device 22 to electrically conductive traces on the dielectric layer 26. The proximity detector 20 also includes additional transparent adhesive material 28 between the image sensor IC 24 and the lens 27. A potential drawback to this proximity detector 20 includes a multi-step high precision assembly process using a P&P device. Also, the proximity detector 20 may be less reliable and difficult to integrate into mobile devices, due to size constraints.

SUMMARY

In view of the foregoing background, it is therefore an object of the present disclosure to provide a proximity detector device that is efficient to manufacture.

This and other objects, features, and advantages in accordance with the present disclosure are provided by a proximity detector device comprising a first interconnect layer comprising a first dielectric layer, and a plurality of first electrically conductive traces carried thereby, an IC layer above the first interconnect layer and comprising an image sensor IC, and a light source IC laterally spaced from the image sensor IC. The proximity detector may comprise a second interconnect layer above the IC layer and comprising a second dielectric layer, and a plurality of second electrically conductive traces carried thereby. The second interconnect layer may have first and second openings therein respectively aligned with the image sensor IC and the light source IC. Each of the image sensor IC and the light source IC may be coupled to the pluralities of first and second electrically conductive traces. The proximity detector may comprise a lens assembly above the second interconnect layer and comprising first and second lenses respectively aligned with the first and second openings. Advantageously, the proximity detector may be manufactured using robust wafer level processing techniques and have a reduced size.

In particular, the IC layer may comprise encapsulation material laterally surrounding the image sensor IC and the light source IC. The encapsulation material may comprise a plurality electrically conductive vias, each coupled between a respective aligned pair of the pluralities of first and second electrically conductive traces.

The proximity detector device may further comprise transparent adhesive material in the first and second openings of the second interconnect layer. In some embodiments, the lens assembly may further comprise a molding compound surrounding the first and second lenses, and having first and second openings aligned with respective ones of the first and second lenses.

Additionally, the proximity detector device may further comprise a plurality of contacts coupled respectively to the plurality of first electrically conductive traces. For example, the plurality of contacts may comprise a plurality of ball grid array (BGA) contacts. The first lens may comprise a filter lens. The light source IC may comprise a light emitting diode.

Another aspect is directed to a method of making a proximity detector device. The method may comprise forming a first interconnect layer comprising a first dielectric layer, and a plurality of first electrically conductive traces carried thereby, forming an IC layer above the first interconnect layer and comprising an image sensor IC, and a light source IC laterally spaced from the image sensor IC. The method may include forming a second interconnect layer above the IC layer and comprising a second dielectric layer, and a plurality of second electrically conductive traces carried thereby. The second interconnect layer may have first and second openings therein respectively aligned with the image sensor IC and the light source IC. Each of the image sensor IC and the light source IC may be coupled to the pluralities of first and second electrically conductive traces. The method may also include forming a lens assembly above the second interconnect layer and comprising first and second lenses respectively aligned with the first and second openings.

DETAILED DESCRIPTION OF THE PREFERRED EMBODIMENTS

The present embodiments will now be described more fully hereinafter with reference to the accompanying drawings, in which preferred embodiments of the present disclosure are shown. This present embodiments may, however, be embodied in many different forms and should not be construed as limited to the embodiments set forth herein. Rather, these embodiments are provided so that this disclosure will be thorough and complete, and will fully convey the scope of the present embodiments to those skilled in the art. Like numbers refer to like elements throughout, and prime notation is used to indicate similar elements in alternative embodiments.

Figure 2:
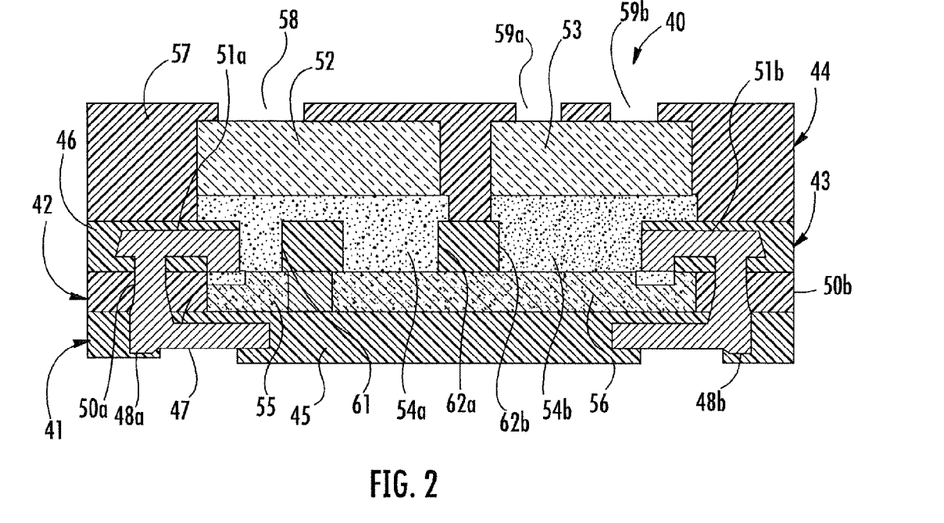
FIG. 2 is a schematic cross-sectional view of a proximity detector device, according to the present disclosure.
Figure 3:
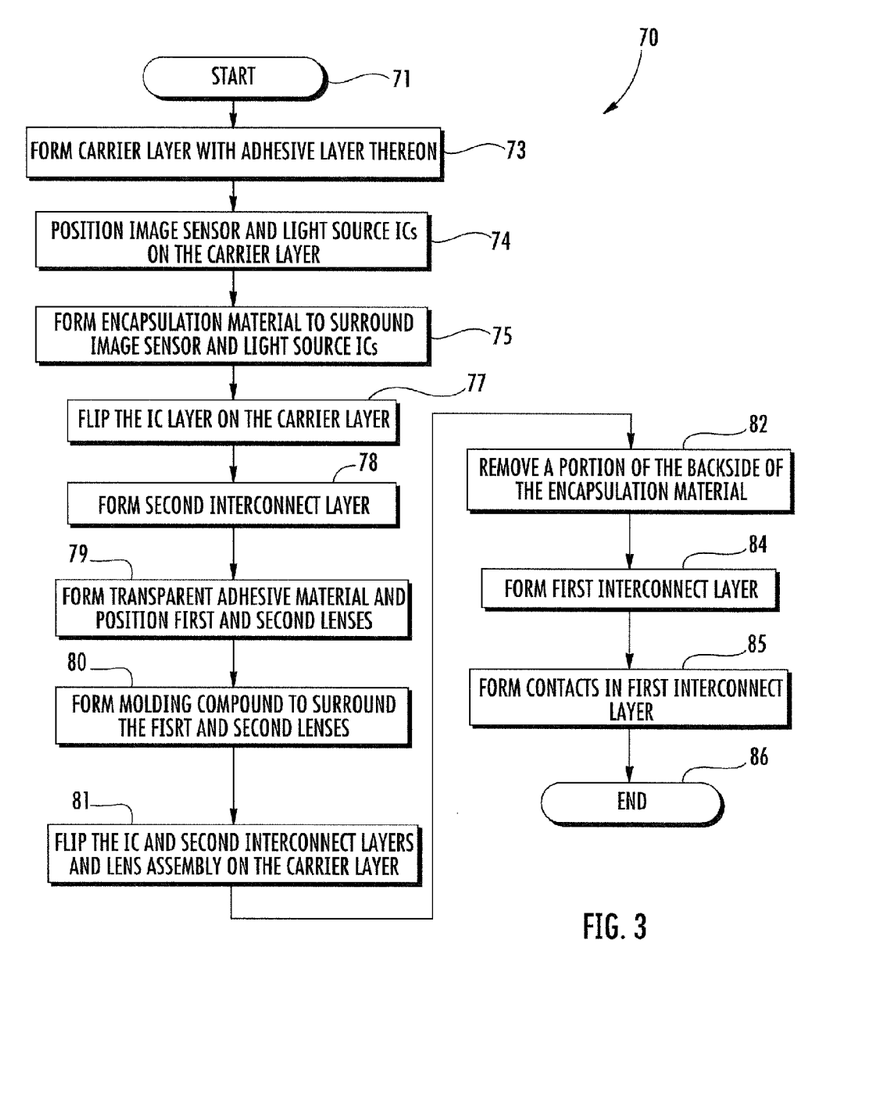
FIG. 3 is a flowchart of a method for making the proximity detector device of FIG. 2.

Referring initially to FIG. 2, a proximity detector device 40 according to the present disclosure is now described. The proximity detector device 40 illustratively includes a first interconnect layer 41 comprising a first dielectric layer 45, and a plurality of first electrically conductive traces 48a-48b carried thereby. The proximity detector device 40 illustratively includes an IC layer 42 above the first interconnect layer 41 and comprising an image sensor IC 56, and a light source IC 55 laterally spaced from the image sensor IC. The light source IC 55 may comprise a light emitting diode (LED), such as an infrared LED.

The proximity detector device 40 illustratively includes a second interconnect layer 43 above the IC layer 42 and comprising a second dielectric layer 46, and a plurality of second electrically conductive traces 51a-51b carried thereby. The second interconnect layer 43 illustratively includes first openings 62a-62b and a second opening 61 therein respectively aligned with the image sensor IC 56 and the light source IC 55. Each of the image sensor IC 56 and the light source IC 55 is coupled to the pluralities of first 48a-48b and second 51a-51b electrically conductive traces.

In the illustrated embodiment, the first openings 62a-62b are illustratively aligned with the image sensor IC 56. The pair of first openings 62a-62b provides the imaging sensor IC 56 with access to the first and second lenses cavities.

The proximity detector device 40 illustratively includes a lens assembly 44 above the second interconnect layer 43. The lens assembly 44 illustratively includes first 53 and second 52 lenses respectively aligned with the first openings 62a-62b and the second opening 61.

In particular, the IC layer 42 includes encapsulation material 47 laterally surrounding the image sensor IC 56 and the light source IC 55. The encapsulation material 47 illustratively includes a plurality electrically conductive vias 50a-50b passing therethrough. Each electrically conductive via 50a-50b is coupled between a respective aligned pair of the pluralities of first 48a-48b and second 51a-51b electrically conductive traces.

The proximity detector device 40 illustratively includes transparent adhesive material 54a-54b in the first openings 62a-62b and the second opening 61 of the second interconnect layer. In the illustrated embodiment, the lens assembly 44 includes a molding compound 57 surrounding the first 53 and second 52 lenses. The lens assembly 44 illustratively includes first openings 59a-59b and a second opening 58 aligned with respective ones of the first 53 and second 52 lenses. In the illustrated embodiment, the first openings 59a-59b are aligned with the first lens 53.

Additionally, the proximity detector device illustratively includes a plurality of contacts 49a-49b (FIG. 16) coupled respectively to the plurality of first electrically conductive traces 48a-48b. For example, the plurality of contacts 49a-49b (FIG. 16) may comprise a plurality of BGA contacts. The first lens 53 may comprise a filter lens (e.g. glass filter or transparent sheet with filter coating). The first lens 53 may also comprise a focusing element in addition or alternatively.

Another aspect is directed to a method of making a proximity detector device 40. The method may comprise forming a first interconnect layer 41 comprising a first dielectric layer 45, and a plurality of first electrically conductive traces 48a-48b carried thereby. The method may include forming an IC layer 42 above the first interconnect layer 41 and comprising an image sensor IC 56, and a light source IC 55 laterally spaced from the image sensor IC. The method may include forming a second interconnect layer 43 above the IC layer 42 and comprising a second dielectric layer 46, and a plurality of second electrically conductive traces 51-51b carried thereby. The second interconnect layer may have first openings 62a-62b and a second 61 opening therein respectively aligned with the image sensor IC 56 and the light source IC 55, each of the image sensor IC and the light source IC being coupled to the pluralities of first 48a-48b and second 51-51b electrically conductive traces. The method may also include forming a lens assembly 44 above the second interconnect layer 43 and comprising first 53 and second 52 lenses respectively aligned with the first openings 62a-62b and the second opening 61.

Figure 4:
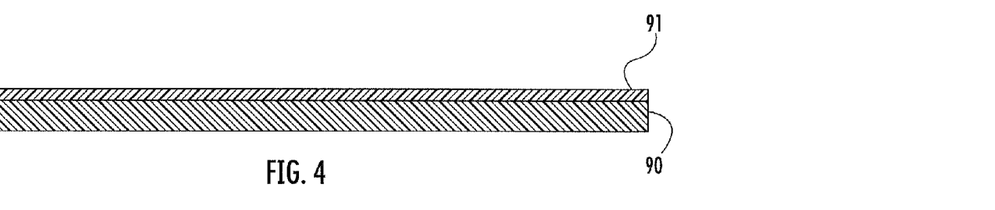
FIGS. 4-13 are schematic cross-sectional views of steps for making the proximity detector device of FIG. 2.
Figure 5:
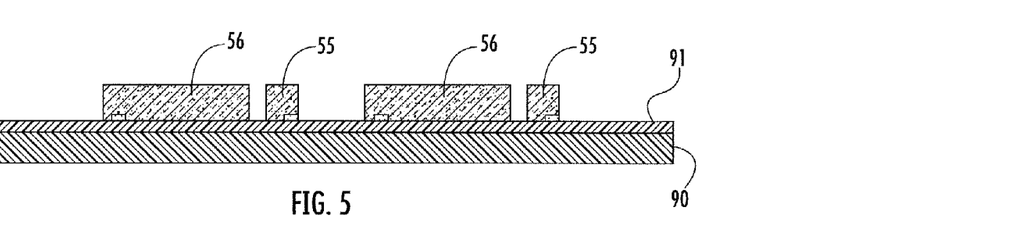
Figure 6:
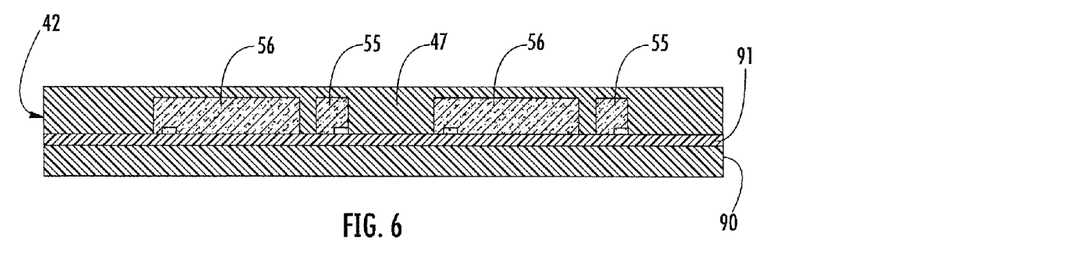

Referring now additionally to FIGS. 3-16, a flowchart 70 illustrates a method for making the semiconductor device 20 (Block 71). In the illustrated embodiments, a wafer level processing technique for making a pair of identical proximity detector devices 40 is shown, but it should be appreciated that typical processes would include the manufacture of a large number of proximity detector devices (sometimes including varying embodiments in a single manufacturing process, i.e. the illustrated adjacent proximity detectors need not be identical). The method includes forming a carrier layer 90, and an adhesive layer 91 on the carrier layer (FIG. 4 and Block 73). The method includes positioning image sensor ICs 56 and light source ICs 55 on the adhesive layer 91 (FIG. 5 and Block 74). At this point, any other desired surface mount devices (e.g. capacitors) may also be positioned. The method includes forming an encapsulation material 47 on the image sensor ICs 56 and light source ICs 55 to define an IC layer 42 (FIG. 6 and Block 75).

Figure 7:
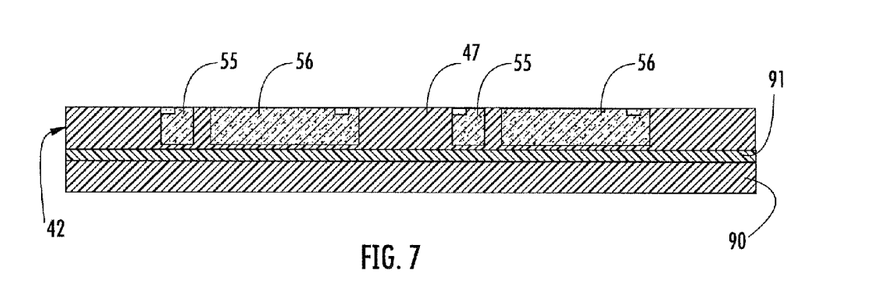
Figure 8:
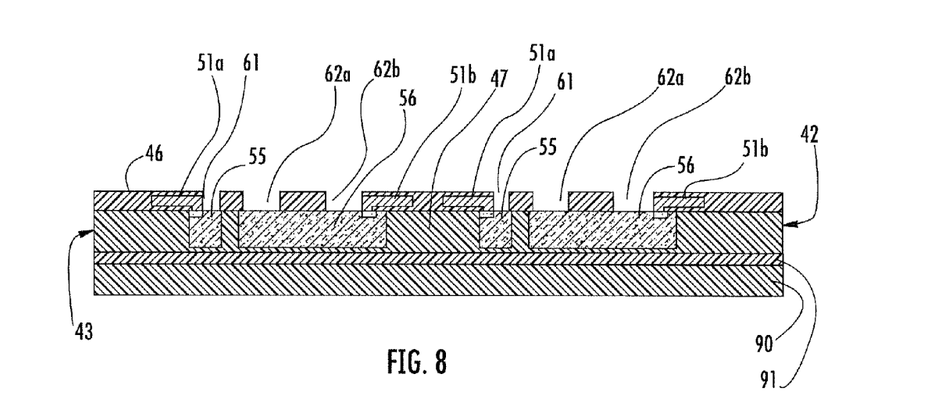

The method includes flipping the IC layer 42 on the carrier layer 90 by heating the adhesive layer 91 to detach the IC layer and reapplying the IC layer to the adhesive layer on an opposite face thereof (FIG. 7 and Block 77). The method also includes forming a second interconnect layer 43 and a plurality of second electrically conductive traces 51*a*-51*b* carried thereby (FIG. 8 and Block 78).

Figure 9:
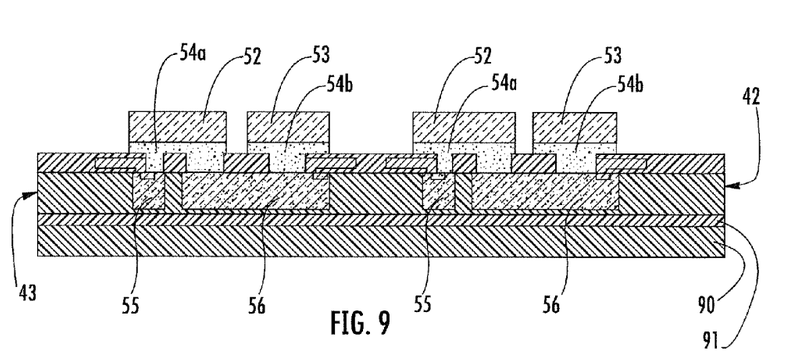

The method includes forming a transparent adhesive material 54*a*-54*b* in first openings 62*a*-62*b* and the second opening 61 of the second interconnect layer 43. The method also includes positioning first 53 and second 52 lenses on the transparent adhesive material 54*a*-54*b* (FIG. 9 and Block 79).

Figure 10:
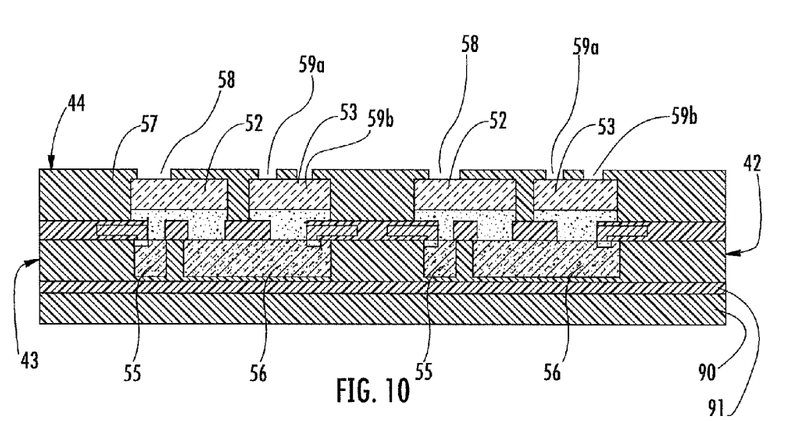
Figure 11:
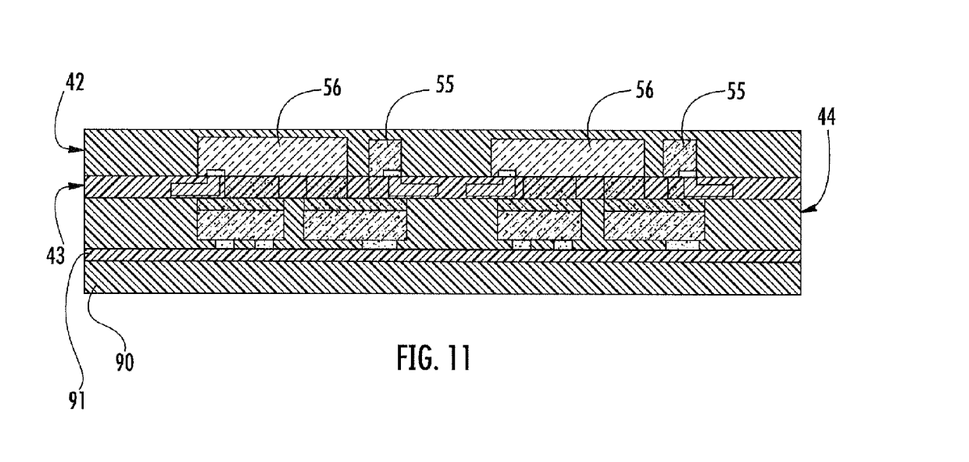
Figure 12:
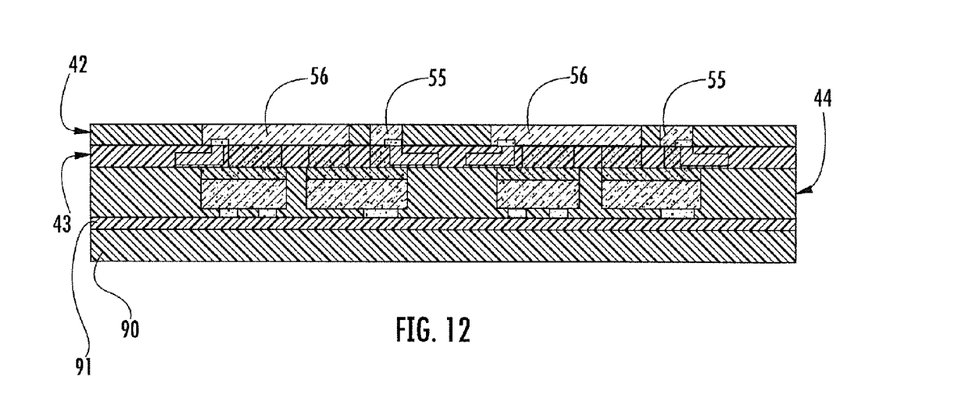

The method includes forming molding compound 57 on the first 53 and second 52 lenses to define a lens assembly 44 (FIG. 10 and Block 80). In some embodiments, the forming of the molding compound 57 may be film assisted. The method includes flipping the IC 42 and second interconnect layers 43, and lens assembly 44 on the carrier layer 90 (FIG. 11 and Block 81) (again using a heating step to deactivate the adhesive layer 91). The method includes grinding a portion of the backside of the IC layer 42 (FIG. 12 and Block 82).

Figure 13:
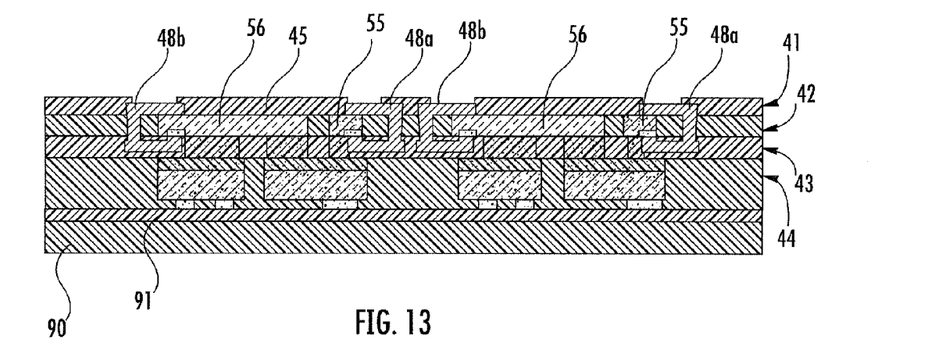

The method includes forming a first interconnect layer 41 comprising a first dielectric layer 45, and a plurality of first electrically conductive traces 48*a*-48*b* carried thereby (FIG. 13 and Block 84). In this embodiment, the plurality of first electrically conductive traces 48*a*-48*b* defines LGA contacts. The method also includes a singulation step (FIG. 15) (Blocks 84-86).

Advantageously, the proximity detector device 40 may be manufactured using robust wafer level processing techniques. Additionally, the proximity detector device 40 may be made in large quantities. Moreover, the structure is mechanically robust since the first 53 and second 52 lenses are tightly integrated with the lens assembly molding compound 57. Also, the lens assembly 44 is tightly integrated with the first 41, second 43 interconnect layers and the IC layer 43, also adding mechanical rigidity. The packaging of the proximity detector device 40 is thinner than typical approaches, thereby permitting easier integration into mobile devices. Moreover, the proximity detector device 40 provides for good co-planarity for the image sensor and light source ICs 55-56, thereby reducing the computational load of proximity detection calculations (i.e. from having adjacent source and receiver positions).

Figure 14:
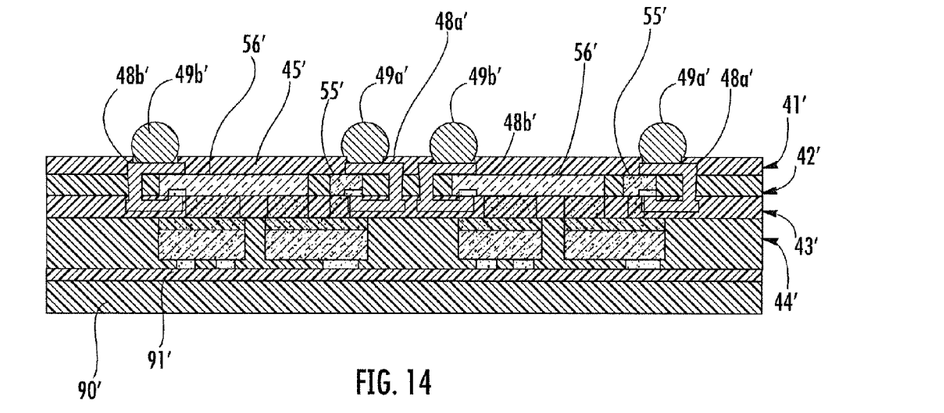
FIGS. 14-16 are schematic cross-sectional views of steps for making another embodiment of the proximity detector, according to the present disclosure.
Figure 15:
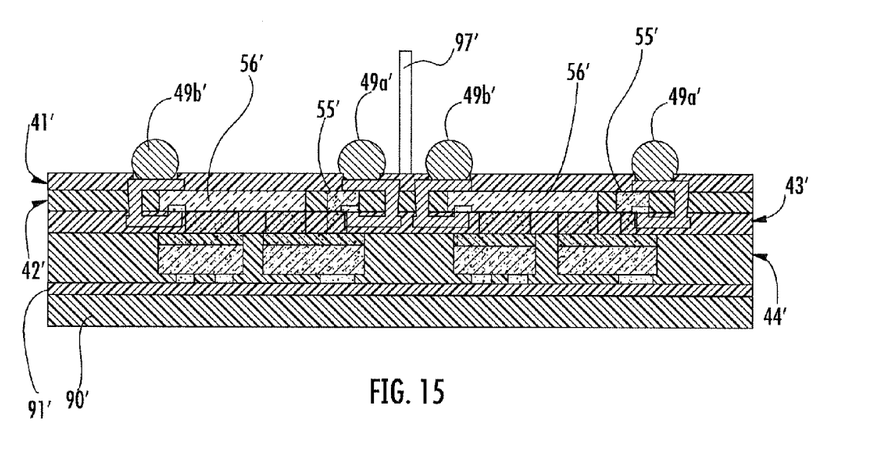
Figure 16:
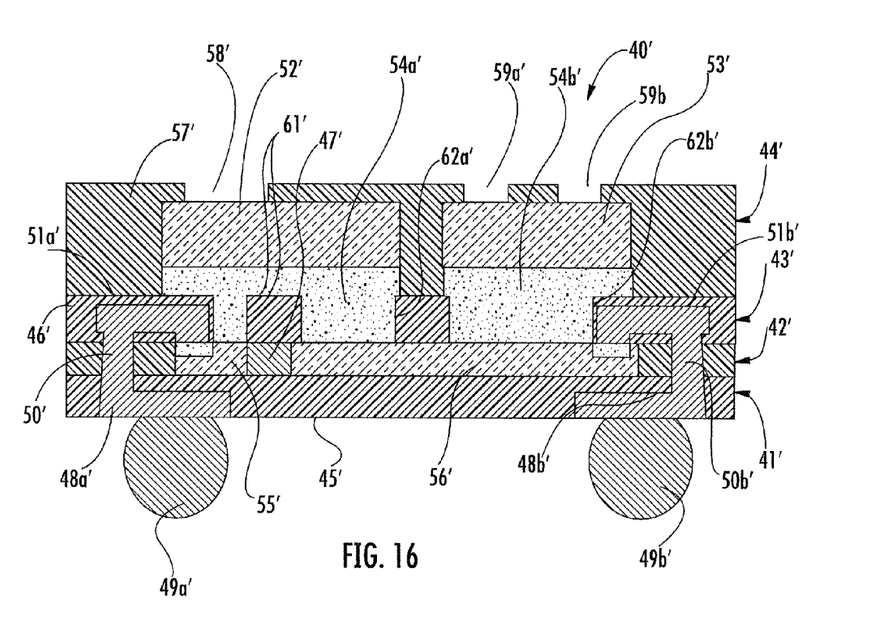

Referring now additionally to FIGS. 14-16, steps from another embodiment of the method for making the proximity detector device 40' is now described. In this embodiment of the method for making the proximity detector device 40', those steps and elements already discussed above with respect to FIGS. 2-13 are given prime notation and most require no further discussion herein. This embodiment differs from the previous embodiment in that this method illustratively includes forming a plurality of ball grid array contacts 49*a'*-49*b'* on the plurality of first electrically conductive traces 48*a'*-48*b'* (FIG. 14 and Block 85). The method illustratively includes a singulation step using a dicing blade 97' (FIGS. 15-16).

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. A proximity detector device comprising:
    a first interconnect layer comprising a first dielectric layer, and a plurality of first electrically conductive traces carried thereby;
    an integrated circuit (IC) layer above said first interconnect layer and comprising
        an image sensor IC, and
        a light source IC laterally spaced from said image sensor IC;
    a second interconnect layer above said IC layer and comprising a second dielectric layer, and a plurality of second electrically conductive traces carried thereby, said second interconnect layer having first and second openings therein respectively aligned with said image sensor IC and said light source IC, the first and second openings having sidewalls being defined by the second dielectric layer;
    said first interconnect layer being separate from and spaced apart from said second interconnect layer;
    each of said image sensor IC and said light source IC coupled to said pluralities of first and second electrically conductive traces;
    a lens assembly above said second interconnect layer and comprising first and second lenses respectively aligned with said first and second openings; and
    a transparent adhesive material, separate from the second dielectric layer and the first and second lenses, completely filling the first and second openings of the second interconnect layer and contacting each of the image sensor IC and light source IC.

2. The proximity detector device of claim 1 wherein said IC layer comprises encapsulation material laterally surrounding said image sensor IC and said light source IC.

3. The proximity detector device of claim 2 wherein said encapsulation material comprises a plurality electrically conductive vias, each coupled between a respective aligned pair of said pluralities of first and second electrically conductive traces.

4. The proximity detector device of claim 1 wherein said lens assembly further comprises a molding compound surrounding said first and second lenses, and having first and second openings aligned with respective ones of said first and second lenses.

5. The proximity detector device of claim 1 wherein said first lens comprises a filter lens.

6. The proximity detector device of claim 1 wherein said light source IC comprises a light emitting diode.

7. A proximity detector device comprising:
    a first interconnect layer comprising a first dielectric layer, and a plurality of first electrically conductive traces carried thereby;
    a plurality of contacts coupled respectively to said plurality of first electrically conductive traces;
    an integrated circuit (IC) layer above said first interconnect layer and comprising
        an image sensor IC,
        a light source IC laterally spaced from said image sensor IC, and
        encapsulation material laterally surrounding said image sensor IC and said light source IC;
    a second interconnect layer above said IC layer and comprising a second dielectric layer, and a plurality of second electrically conductive traces carried thereby, said second interconnect layer having first and second openings therein having sidewalls defined by material of the second dielectric layer and respectively aligned with said image sensor IC and said light source IC;

said first interconnect layer being separate from and spaced apart from said second interconnect layer;

each of said image sensor IC and said light source IC coupled to said pluralities of first and second electrically conductive traces;

a lens assembly above said second interconnect layer and comprising first and second lenses respectively aligned with said first and second openings; and a transparent adhesive material completely filling the first and second openings of the second interconnect layer and contacting the image sensor IC and light source IC, the transparent adhesive material having a first surface adhered to the first and second lenses.

8. The proximity detector device of claim 7 wherein said encapsulation material comprises a plurality electrically conductive vias, each coupled between a respective aligned pair of said pluralities of first and second electrically conductive traces.

9. The proximity detector device of claim 7 wherein said lens assembly further comprises a molding compound surrounding said first and second lenses, and having first and second openings aligned with respective ones of said first and second lenses.

10. A method of making a proximity detector device comprising:

forming a first interconnect layer comprising a first dielectric layer, and a plurality of first electrically conductive traces carried thereby;

forming an integrated circuit (IC) layer above the first interconnect layer and comprising
 an image sensor IC, and
 a light source IC laterally spaced from the image sensor IC;

forming a second interconnect layer above the IC layer and comprising a second dielectric layer, and a plurality of second electrically conductive traces carried thereby, the second interconnect layer having first and second openings therein having sidewalls defined by dielectric material of the second dielectric layer and respectively aligned with the image sensor IC and the light source IC, each of the image sensor IC and the light source IC coupled to the pluralities of first and second electrically conductive traces, the first interconnect layer being separate from and spaced apart from the second interconnect layer;

completely filling the first and second openings of the second interconnect layer with a transparent adhesive material, the transparent adhesive material contacting the image sensor IC and light source IC; and forming a lens assembly above the second interconnect layer and comprising first and second lenses respectively aligned with the first and second openings and adhered to a first surface of the transparent adhesive material.

11. The method of claim 10 wherein the forming of the IC layer comprises forming encapsulation material to laterally surround the image sensor IC and the light source IC.

12. The method of claim 11 wherein the forming of the IC layer comprises forming a plurality electrically conductive vias in the encapsulation material, each electrically conductive via coupled between a respective aligned pair of the pluralities of first and second electrically conductive traces.

13. The method of claim 10 wherein the forming of the lens assembly further comprises forming a molding compound to surround the first and second lenses, and to have first and second openings aligned with respective ones of the first and second lenses.

14. The proximity detector device of claim 1 wherein said pluralities of first and second electrically conductive traces are coupled together.

15. The proximity detector device of claim 4, wherein a portion of the transparent adhesive material extends out of the second interconnect layer and is surrounded by the molding compound.

16. The proximity detector device of claim 7, wherein a second surface of the transparent adhesive material is adhered to a portion of the image sensor IC and a portion of the light source IC.

17. The proximity detector device of claim 7, wherein the transparent adhesive material is distinct from the second dielectric layer and the first and second lenses.

18. The proximity detector device of claim 9, wherein the molding compound surrounds a portion of the transparent adhesive material extending out of the second interconnect layer.

19. The method of claim 10, wherein a second surface of the transparent adhesive material is adhered to a portion of the image sensor IC and a portion of the light source IC.

20. The method of claim 13, wherein a first portion of the transparent adhesive material is surrounded by the second dielectric layer, and wherein a second portion of the transparent adhesive material is surrounded by molding compound.

* * * * *